Sept. 9, 1969 H. W. THIM 3,466,563

BULK SEMICONDUCTOR DIODE DEVICES

Filed Nov. 22, 1967 2 Sheets-Sheet 1

INVENTOR
H. W. THIM
BY
Roderick B. Anderson
ATTORNEY 3,466,563
BULK SEMICONDUCTOR DIODE DEVICES Hartwig W. Thim, Summit, N.J., assignor to Bell Telephone Laboratories, Incorporated, Murray Hill and Berkeley Heights, N.J., a corporation of New York Filed Nov. 22, 1967, Ser. No. 685,144
Int. Cl. H03f 3/10
U.S. Cl. 330—34 13 Claims

ABSTRACT OF THE DISCLOSURE

A two-valley semiconductor diode comprises a plurality of alternatively active and passive regions between opposite ohmic contacts. The active regions each have an appropriate (sample length) × (carrier concentration) product to give amplification, while the passive regions have a sufficient length and either a sufficiently high conductivity or cross-sectional area to prevent the space-charge accumulation responsible for high field domain formation. Both amplifier and oscillator embodiments are disclosed.

Background of the invention

The structure and operation of a new family of semiconductor devices known variously as two-valley devices, bulk-effect devices, and Gunn-effect diodes, are described in detail in a series of papers in the January 1966 issue of "IEE Transactions on Electron Devices," vol. ED–13, No. 1. As set forth in these papers, high frequency Gunn-effect mode oscillations can be obtained by applying an appropriate direct current voltage across a suitable "two-valley" semiconductor sample of substantially homogeneous constituency. The applied field excites electrons from a low energy band valley to a higher energy band valley where they have a lower mobility.

This population transfer gives rise to current instabilities in the device which in turn result in the formation of discrete regions of high electric field intensity and corresponding space-charge accumulation, called domains, that travel from the negative to the positive contact at approximately the carrier drift velocity. The bulk material presents a differential negative resistance to internal currents in the region of the domain, causing the electric field intensity of the domain to grow as it travels toward the positive contact. Because the domains are formed successively and a new domain can be formed only after a previous one has been extinguished, the output frequency is dependent on sample length; on the other hand, the output power is an inverse function of sample length which makes the device frequency and power limited.

The copending patent application of J. A. Copeland III, Ser. No. 564,081, filed July 11, 1966, and the paper by J. A. Copeland III, "A New Mode of Operation for Bulk Negative Resistance Oscillators," Proceedings of the IEEE, October 1966, pages 1479–1480, describe how a new mode of oscillation, called the LSA mode (for Limited Space-charge Accumulation), can be induced in two-valley diodes. This new mode of oscillation is not dependent on the formation of traveling domains, its frequency is not dependent on sample length, and as a result, the oscillator does not have the frequency and power limitations described above. The LSA mode oscillator includes a two-valley semiconductor diode, a resonant circuit, and a load, the various parameters of which are adjusted such that the electric field intensity within the diode alternates between a high valley at which negative resistance occurs, and a lower valley at which the diode displays a positive resistance. By appropriately adjusting the duration of electric field excursions into the positive and negative regions of the diode, one can prevent the formation of the traveling domains responsible for Gunn-mode oscillation, while still obtaining the net negative resistance required for sustained oscillations. Although this device constitutes an improvement in bulk diode oscillators, it, like the conventional Gunn-effect oscillator, cannot be used as an amplifier.

It should be noted however, that the copending application of Thim, Ser. No. 605,644, filed Dec. 29, 1966, and assigned to Bell Telephone Laboratories, Incorporated, describes how external circuitry can be devised to obtain amplification from a Gunn-effect oscillator.

The bulk-effect devices described in the literature have virtually all been made of n-type gallium arsenide. The gallium arsenide Gunn-effect diode and the LSA diode generally have a product of sample length and carrier concentration that exceeds $10^{12}$ centimeters$^{-2}$. The copending application of Hakki-Thim-Uenohara, Ser. No. 632,102, filed Apr. 19, 1967, and assigned to Bell Telephone Laboratories, Incorporated, describes how the product of sample length and carrier concentration of a bulk two-valley diode can be controlled so as to create a regime of bulk negative differential resistance in which amplification can occur, but in which high field traveling domains cannot be formed. One restriction on this amplifier is that, unlike Gunn-effect diodes, the (carrier concentration) × (sample length) product must be maintained below approximately $10^{12}$ centimeters$^{-2}$. This results in a limitation of the power level at which the device can be operated; like the Gunn-effect oscillator, conditions of high power operation will "burn out" the sample if the sample is not long enough to permit adequate heat sinking. A related restriction is that the product of power and impedance of the diode is inversely proportional to the square of the operating frequency, which limits the choice of load impedance and operating frequency as well as power level.

The Hakki et al. device can also be operated as an oscillator, and, while it can be operated at higher frequencies than Gunn-effect oscillators of the same sample length, it is nevertheless frequency and power limited to the same extent as the amplifier embodiment. The device is sometimes known as the "sub-critically doped amplifier" because of its low carrier concentration and as the "sub-threshold amplifier" because of its low bias voltage with respect to its carrier concentration and sample length.

Summary of the invention

I have found that the frequency and the power-impedance limitations of a diode that works on the principles described in the aforementioned Hakki et al. application can be avoided by using between the diode contacts a plurality of active regions each separated by a passive region having a much higher conductivity than the active regions. Each of the active regions is made of an appropriate two-valley bulk material such as n-type gallium arsenide for displaying a differential negative resistance in response to the voltage applied between the opposite contacts, but each active region is sufficiently short to prevent the formation of a high electric field traveling domain. Because of the high conductivity of each passive region, the electric field in each passive region drops to a value which is sufficiently small to dissipate space-charge accumulations and thereby to prevent domains from forming as a result of accumulation layers that would otherwise travel through successive active regions. These requirements are met by satisfying specified relationships between the parameters of the active and passive regions which will be given in detail later.

Since the passive regions preclude the space-charge accumulation responsible for unwanted Gunn-effect oscillations, there is no apparent restriction on the actual total length of the diode. As a result, the diode can be operated at a much higher power than can the Hakki et al. diode. Further, the power-impedance product of the diode is not critically dependent on frequency as is the Hakki et al. diode. Like the Hakki et al. device, my diode can be used as either an oscillator or an amplifier, but its most promising use appears to be as an amplifier because of the present need for solid state amplifiers that can amplify extremely high microwave frequencies at reasonably high power levels.

In another embodiment, the passive regions are of the same conductivity as the active regions, but have a higher cross-sectional area than the active regions. This higher area results in an electric field drop sufficient to dissipate space-charge accumulation layers.

Description of the drawing

These and other features and advantages of the invention will be better understood from a consideration of the following detailed description, taken in conjunction with the accompanying drawing in which.

Detailed description

Figure 1:
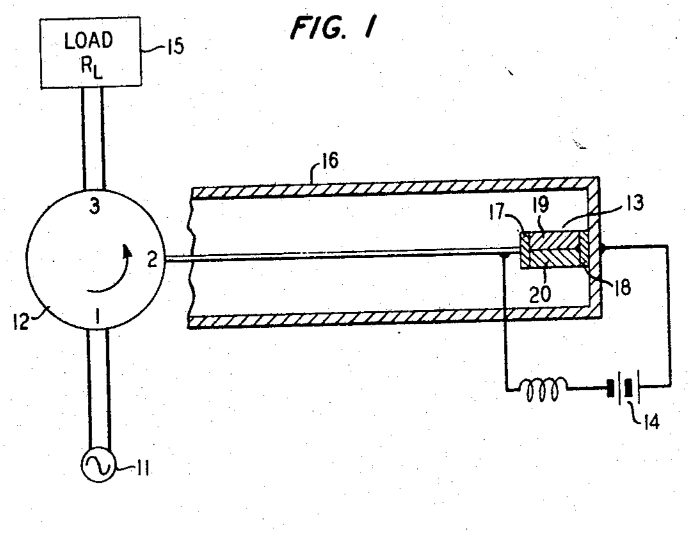
FIG. 1 is a schematic illustration of one embodiment of the invention.

Referring now to FIG. 1 there is shown schematically an amplifier circuit in accordance with an illustrative embodiment of the invention comprising a microwave signal source 11, a circulator 12, a bulk semiconductor amplifying diode 13, a direct current voltage source 14, and a load 15 having a load resistance $R_L$. The operation of the circuit is essentially the same as that described in the aforementioned Hakki et al. application: Signal waves from source 11 are transmitted by circulator 12 to a transmission line 16 where they are transmitted through the diode 13 and reflected back to the circulator and hence to the load 15.

The diode 13 comprises opposite ohmic contacts 17 and 18, a semiconductor portion 19, and a dielectric or semi-insulating substrate 20. Like the device of the Hakki et al. application, the diode 13 amplifies by virtue of a differential negative resistance in the semiconductor resulting from the controlled electron transfer, or population redistribution, from a lower energy band valley in the conduction band of the semiconductor to a higher energy band valley. The bias voltage supplied by battery 14 produces a sufficient electric field intensity in the diode to cause population redistribution, but not so great as to cause instabilities resulting in oscillation. Unlike the Hakki et al. device, however operation of diode 13 is not critically dependent on its length, which permits it to be operated under conditions of higher power for a given high frequency, and also permits greater flexibility in the choice of the product of diode power and impedance.

Figure 2A:
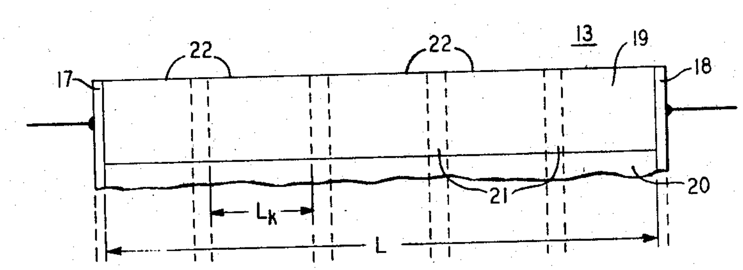
FIG. 2A is a schematic illustration of part of the diode of FIG. 1.

Referring to FIG. 2A, the diode 13 comprises a plurality of active regions 22 located alternately with respect to a plurality of passive regions 21. Each active region 22 is made of an appropriate two-valley bulk material having an appropriate carrier concentration and axial length to give amplification in the small signal space-charge wave mode as described in the Hakki et al. application.

In accordance with the criteria set forth in the Hakki et al. application, the active regions 22 should display the following characteristics: The upper and lower energy band valleys are separated by a sufficiently small energy level that population redistribution can take place at field intensities that are not so high as to be destructive of the material; at zero field intensities, the carrier concentration in the lower band is at least 10 times that in the upper band at the temperature of operation; the mobility of carriers in the lower energy band ($\mu_1$) is more than 5 times greater than the mobility in the upper energy band ($\mu_2$). In addition, the carrier concentration $N_k$ and the axial length $L_k$ of each active region should conform to other parameters in the active region according to the relationship $$\frac{\epsilon 4\pi^2 D_1}{q\mu_1 L_k} < N_k L_k(1+\gamma) < 2.2\frac{\epsilon v_{01}}{q\mu_1} \tag{1}$$

where $D_1$ is the diffusion constant, $v_{01}$ is the carrier drift velocity, $\mu_1$ is the lower energy band mobility, $\epsilon$ is the dielectric permittivity, and $\gamma$ is the field rate of transfer of carriers from the lower energy band valley to the upper energy band valley. The parameter $\gamma$ is dependent on applied voltage, and for negative resistance to occur, the electric field in each active region must be above a threshold value $E_I$, but must not be so large as to excite traveling domains.

Figure 2B:
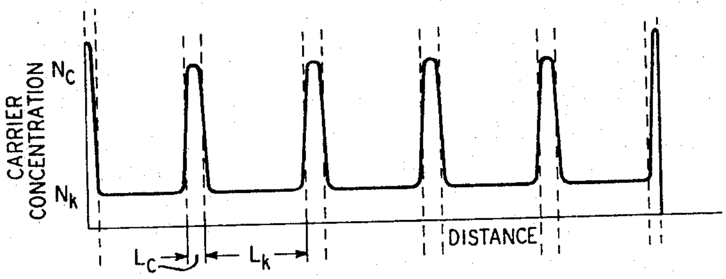
FIG. 2B is a graph of carrier concentration versus distance in the diode of FIG. 2A.
Figure 2C:
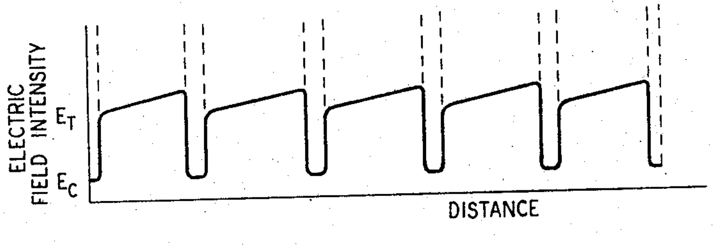
FIG. 2C is a graph of electric field versus distance in the diode of FIG. 2A when a voltage is applied between opposite contacts of the diode.

Although each individual active region 22 satisfies the length limitations of relationship (1), the entire diode between the contacts 17 and 18 does not. In spite of the fact that the total length L of the diode 13 between opposite contacts is much longer than the length restriction of relationship (1), the diode does not form traveling electric field domains and thereby break into Gunn-effect oscillations because the passive regions 21 prevent the space-charge accumulation responsible for the formation of high field domains. As illustrated in the graph of FIG. 2B, in which the distance coordinate corresponds to the physical diode length shown in FIG. 2A, the passive regions 21 have a much higher conductivity and carrier concentration $N_c$ than the conductivity and carrier concentration $N_k$ of the active regions. Because of such high conductivity, the electric field intensity within the passive regions 21 must be very small as illustrated by the graph of FIG. 2C in which $E_c$ is the electric field in passive regions 21. $E_T$ is the threshold electric field required for giving negative resistance in the active regions 22; in other words, $E_T$ is the field required for giving a field rate of transfer $\gamma$ which is within the limits specified by Equation 1 with respect to each of the active regions 22.

It can be seen intuitively from FIG. 2C that a space-charge accumulation cannot grow continuously as it travels from the negative to the positive contact of the diode because of the electric field reduction in each of the passive regions. In addition, the electric field $E_c$ should be low enough, and the length $L_c$ of each passive region should be long enough, to cause a substantial decay or dissipation of any space-charge accumulation layer that travels through the passive region. Computer analysis shows that the electric field $E_c$ and the length $L_c$ should comply with the relations, $$E_c < \frac{E_T}{M} \tag{2}$$

$$L_c \geq M X_{Dc} \tag{3}$$

where M is a number larger than 1, and $X_{Dc}$ is the Debye length of the passive regions which is given by, $$X_{Dc} = \frac{D_c \epsilon_c}{q\mu_c N_c} \tag{4}$$

where $q$ is the charge on a majority current carrier and the subscripts $c$ refer to the passive regions.

For some materials, the number M should be chosen to be considerably larger than 1 to ensure complete dissipation of any space-charge layer in the passive region. For n-type gallium arsenide it is preferred that M be equal to or greater than 10.

Relationship (2) can be expressed in terms of the relative carrier concentrations in the active and passive regions by considering the current continuity equations:

$$I=\mu_c N_c E_c \quad (5)$$

$$I=N_k v_{01} \quad (6)$$

where I is current. Substituting (2) into Equations 5 and 6, gives $$\frac{N_c}{N_k}>\frac{Mv_{01}}{\mu_c E_T} \quad (7)$$

With the above conditions fulfilled, the diode will display the differential negative resistance required for giving stable amplification but will not break into traveling domain or Gunn-effect oscillations even though its total length is much longer than the limit prescribed in the Hakki et al. application.

While relationship (3) indicates that $L_c$ should be larger than some minimum value, it should not, on the other hand, be so large as to add unnecessary parasitic resistances and inductances. Moreover, if $L_c$ becomes comparable to the free space wavelength of the signal, modifications would have to be made to maintain the proper phase of the signal wave. In virtually all cases, these complications can be avoided by making the length of each passive region smaller than approximately one-tenth of the active region or, $$L_c<\frac{L_k}{10} \quad (8)$$

Figure 3:
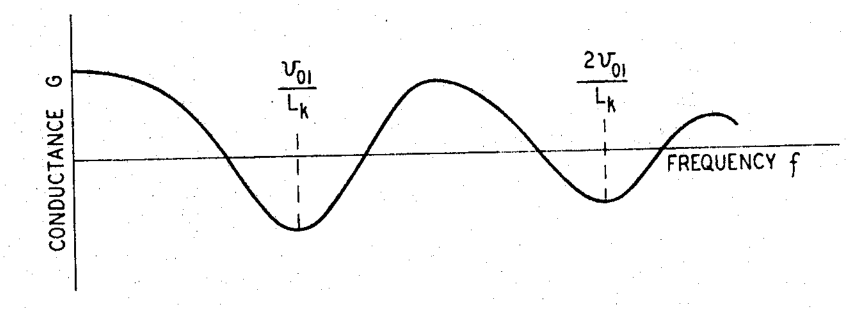
FIG. 3 is a graph of conductance versus frequency in one of the active regions of the diode of FIG. 2A.

The Hakki et al. application points out that the conductance of the amplifying diode is a function of frequency and is negative within frequency bands each approximately centered about a frequency equal to an integral multiple of the drift velocity divided by the sample length. Likewise, in the diode of FIG. 1, negative conductance and resulting amplification occurs at periodic frequency bands each centered approximately about a frequency $$f=\frac{Nv_{01}}{L_k} \quad (9)$$

where N is an integer. These frequencies are illustrated in FIG. 3 which is a graph of diode conductance versus frequency. The Hakki et al. application includes an expression from which the conductance at any frequency can be readily determined.

Figures 4, 5:
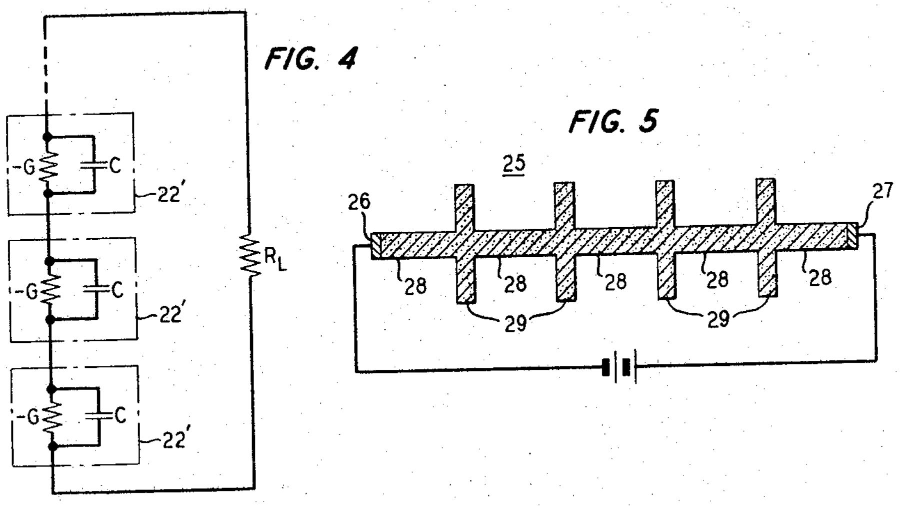
FIG. 4 is a schematic illustration of an oscillator circuit in which my invention may be used.
FIG. 5 is a schematic illustration of a diode in accordance with another embodiment of the invention.

When the Hakki et al. amplifier is connected in an amplifier circuit it is a stable device and in general will oscillate only if a tank circuit, or at least an inductor, is included in the external circuit. The amplifier of FIG. 1, however, is more susceptible to instability because a number of active regions are in effect biased in series; this creates a tendency for a single active region to oscillate in the space-charge mode even though the other active regions do not oscillate and the formation of traveling domains is prevented. FIG. 4 shows an equivalent circuit of the circuit of FIG. 1 in which each of the active regions 22′ is designated by a negative conductance $-G$ in parallel with a capacitance C. Computer analysis of this circuit shows that none of the active regions will oscillate if the following relationship is met:

$$\frac{k}{|-G|}>R_L \quad (10)$$

where $R_L$ is the load resistance and $k$ is the number of active regions. The shunt capacitance provided by the substrate 20 also helps to stabilize the diode.

Another advantage of the substrate 20 is that it provides heat sinking for the relatively small active regions that would otherwise be substantially thermally isolated. In practice, the inclusion of the substrate does not complicate, and in many cases simplifies, diode fabrication for the following reasons: Bulk effect diodes with the required uniformity and freedom from defects are at present most conveniently made by epitaxially growing the n-type gallium arsenide active layer on a semi-insulating gallium arsenide substrate. The diode of FIG. 2A can therefore be made by epitaxially growing a continuous layer having the carrier concentration $N_k$ of the active regions on an upper surface of a semi-insulating gallium arsenide substrate 20. The passive regions 21 can then be made by diffusing impurities into the epitaxial layer to increase drastically the conductivity of the selected passive regions. The relative conductivity of the passive and active regions should, of course, conform to relationship (7) while the conductivity of each active region must conform to relationship (1). Alternatively, the passive regions could be created by metal impregnation through the known technique of ion implantation. Numerous other techniques could, of course, also be used for fabricating diodes having the characteristics described above.

Like the Hakki et al. device, the device of FIG. 2A can be made to oscillate by connecting it in an oscillator circuit which includes an external resonator or at least an inductor in parallel to the load. The obtainable oscillator output frequency, of course, corresponds to the frequencies shown in FIG. 3 at which the conductance is negative. This oscillator is advantageous with respect to the conventional Gunn oscillator in that it can give a negative conductance at an internal oscillation frequency that is larger than the drift velocity divided by the length. Like the amplifier version, the length of the active regions of the device used as an oscillator must conform to relationship (1), but by using a large number of active regions, the actual length of the diode can be made arbitrarily long.

When used as an oscillator, the device of FIG. 2A is in a gross sense analogous to the LSA oscillator of the aforementioned Copeland application. Whereas the Copeland device uses periodic electric field excursions into positive resistance regions for dissipating space-charge accumulation, my device uses spatially periodic positive resistance regions (the passive regions 21) for this purpose.

The requirement of relationship (2), that the electric field in the passive regions be much smaller than the electric field in the active regions, need not necessarily be satisfied only by using proper carrier concentrations as described in relationship (7). Alternatively, relationship (2) can be satisfied by using passive regions of much greater cross-sectional area than those of the active regions as is shown in the alternative embodiment of FIG. 5. The diode 25 of FIG. 5 comprises opposite ohmic contacts 26 and 27, a plurality of active regions 28, each having a cross-sectional area $A_k$ taken transverse to the diode axis, and a plurality of passive regions 29 each having a cross-sectional area $A_c$ taken transverse to the diode axis. If the carrier concentration in the entire semiconductor is uniform through both the active and passive regions, relationship (2) will nevertheless be satisfied by compliance with the relationship $$\frac{A_c}{A_k}>\frac{Mv_{01}}{\mu_c E_T} \quad (11)$$

The FIG. 5 embodiment may for some purposes be preferable because it can be made from a semiconductor of uniform conductivity. If so desired, a combination of the FIG. 2A and FIG. 5 embodiment can be made by altering both the cross-sectional area and conductivity of each of the passive regions, although no particular advantage in doing so is readily apparent.

The major advantage of the devices of FIGS. 2A and 5 with respect to the prior art is that for a given high frequency of operation they can be operated at a much higher power level than the Hakki et al. device. That power level is dependent upon diode length and can be appreciated from considering the following:

$$P=V_{\sim}I_{\sim} \quad (12)$$

where P is power, $V_{\sim}$ is A-C voltage, and $I_{\sim}$ is A-C current.

$$P=E_{\sim}^2Lq|\mu_-|N_kA_k \quad (13)$$

where L is the total length of the diode, $q$ is the charge on an electron, and $|\mu_-|$ is the average differential negative mobility. Since L can be increased merely by increasing the number of active and passive regions, the power level at the frequency of operation can be increased. In Hakki et al., on the other hand, the length L of the diode is limited.

Another limitation of the Hakki et al. device is that the power-impedance product is inversely proportional to the square of the operating frequency. In my device, the power-impedance product can be adjusted by merely adjusting the number of active and passive regions, as can be appreciated from the following:

$$PR=E^2L^2 \quad (13)$$

where R is the average impedance of the diode and E is the average electric field in the diode;

$$PR=E^2\left(k\frac{L}{k}\right)^2 \quad (14)$$

where $k$ is the number of active regions in the diode;

$$PR=E^2k^2\frac{v_{01}^2}{f^2} \quad (15)$$

Hence, the power impedance product can be adjusted by adjusting the number $k$ of the active regions. This flexibility is advantageous for matching the amplifier to the circuit in which it is to be used.

One limitation in the use of the circuit of FIG. 1 is that the total length of the diode should be small with respect to the wave length in the coaxial cable 16 to ensure against phase distortions when the amplified energy is reflected back toward the circulator 12. This limitation can be circumvented by using the structure of FIG. 6 in which the diode 30 is mounted in a rectangular waveguide 31. The diode comprises a dielectric or semi-insulating substrate 32, three semiconductor portions 33, and ohmic contacts 34 and 35 which make contact with each of the semiconductor portions 33. Each of the semiconductor portions is composed of active and passive regions as shown in FIG. 2A. A tuning plunger 37 is included at the end of the waveguide a quarter wavelength from the diode at the operating frequency. If the diode is to be used as an amplifier, energy is transmitted to the diode from a circulator and reflected back toward the circulator as is indicated by the arrows. The waveguide is excited such that electric fields extend between the top and bottom walls of the waveguide in a direction parallel to the semiconductor portions 33.

Figure 6:
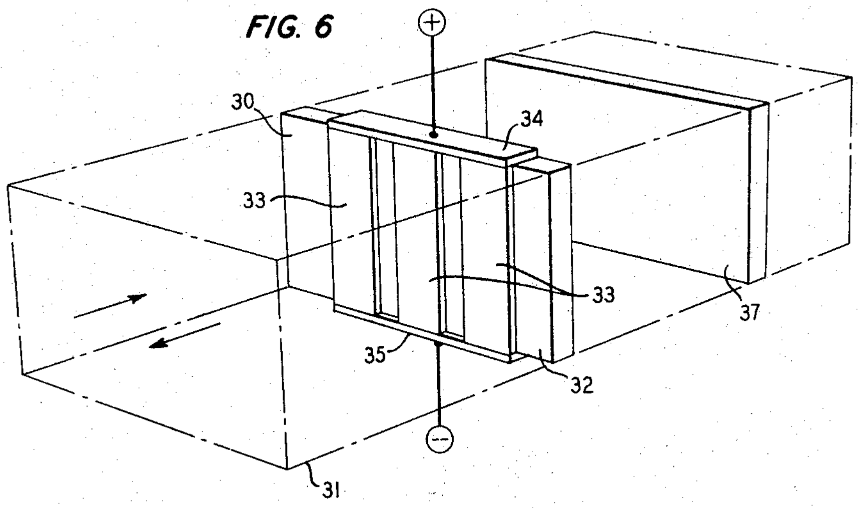
FIG. 6 is a schematic illustration showing how the diode in accordance with my invention may be mounted in a waveguide.

The diode of FIG. 6 works according to the same principles as the diode of FIG. 1: electric fields in the waveguide excite A-C currents in the diode which are amplified by the mechanism described before. The advantage of diode 30 is that it may be as long as the separation of the top and bottom waveguide walls which in turn may be larger than the wavelength of signal energy in the waveguide. In addition, the three semiconductor portions 33 effectively constitute three separate diodes connected in parallel which further increases the flexibility of choice of the power-impedance product of the diode and the power level at which it may be operated.

It is to be understood that the embodiments described above are intended to be merely illustrative of the inventive concept, and that various other embodiments and modifications may be made by those skilled in the art without departing from the spirit and scope of the invention. For example, while the example of n-type gallium arsenide has been used throughout, other two-valley materials could be used, or more specifically, other materials displaying a voltage controlled differential negative resistance could be used. P-type materials using energy band population redistribution in the valence band may be devised which may be used as the diode active regions. Further, while the space-charge mode responsible for differential negative resistance is explained in the Hakki et al. application in terms of small signal theory, the usefulness of the present invention does not appear to be limited to small signal operation.

What is claimed is:

1. A negative resistance device comprising:

a diode comprising ohmic contacts at opposite ends thereof and a plurality of alternately active and passive region between the contacts, the regions being located such that successive active regions are separated by a passive region;

the passive regions each having a substantially higher conductance than the active regions;

the active regions being of bulk two-valley semiconductive material having upper and lower energy bands;

and means comprising a D-C bias source connected to said contacts for transferring current carriers from a lower energy band to an upper energy band;

the parameters of each of said active regions substantially conforming to the relationship $$\frac{\epsilon 4\pi^2 D_1}{q\mu_1 L_k}<N_kL_k(1+\gamma)<2.2\frac{\epsilon v_{01}}{q\mu_1}$$

where $D_1$ is the diffusion constant, $v_{01}$ is the carrier drift velocity, $\mu_1$ is the lower energy band mobility, $\epsilon$ is the dielectric permittivity, $N_k$ is the carrier concentration in the active regions, $L_k$ is the length of each active region, $q$ is the charge on the majority current carrier, and $\gamma$ is the field rate of transfer of carriers from the lower energy band valley to the upper energy band valley.

2. The negative resistance device of claim 1 wherein:

each of the passive regions have substantially an average carrier concentration $N_c$ and an average carrier mobility $\mu_c$ which conform substantially to the relationship $$\frac{N_c}{N_k}\geq\frac{Mv_{01}}{\mu_c E_T}$$

where $E_T$ is the threshold electric field intensity in the active region at which differential negative resistance occurs, and M is a number greater than one.

3. The negative resistance device of claim 2 wherein:

the lengths of the active regions are each substantially equal to $L_k$ and the lengths of the passive regions are each substantially equal to $L_c$ and substantially conform to the relationship $$L_k>L_c>MX_{Dc}$$

where $X_{Dc}$ is the Debye length of the passive regions.

4. The negative resistance device of claim 1 further comprising:

a source of signal waves to be amplified;

a transmission line connected to said signal wave source;

and means comprising said diode for reflecting and amplifying signal waves in the transmission line.

5. The negative resistance device of claim 4 further comprising:

means for directing amplified reflected signal waves to a load having a load resistance $R_L$ which substantially conforms to the relationship, $$\frac{k}{|-G|}>R_L$$

where $-G$ is the negative conductance of each active region at the frequency of operation and $k$ is the number of active regions.

6. A negative resistance device comprising:

a diode comprising a pair of ohmic contacts at opposite ends thereof and a plurality of alternatively active and passive regions between the contacts, the regions being located such that successive active regions are separated by a passive region;

the active regions being made of a two-valley semiconductor material capable of displaying a differential negative resistance in response to an applied electric field intensity $E_T$;

means for applying between the ohmic contacts a voltage sufficient for producing in each of said active semiconductor regions an electric field intensity at least equal to $E_T$;

each of said passive regions having a sufficiently high cross-sectional area with respect to the cross-sectional area of the active regions and a sufficiently high conductivity with respect to the conductivity of each of the active regions to establish within each of the passive regions an electric field $E_c$, in response to said voltage between the opposite ohmic contacts, which substantially conforms to the relationship $$E_c < \frac{E_T}{M}$$

where M is a number greater than one.

7. The negative resistance device of claim 6 wherein: the product of length and carrier concentration in each of said active regions is sufficiently small with respect to the field rate of transfer between energy band valleys resulting from the electric field intensity in the active regions to preclude the independent formation of high field traveling domains in such active regions.

8. The negative resistance device of claim 7 wherein: the length $L_c$ of each of the passive regions substantially conforms to the relationship $$L_C \geq MX_{DC}$$

9. The negative resistance device of claim 8 wherein: the active regions are each made of n-type gallium arsenide having a carrier concentration and length product $N_kL_k$ which is equal to or smaller than approximately $10^{12}$ carriers per square centimeter.

10. A negative resistance device of claim 8 wherein: the active and passive regions all have substantially the same cross-sectional area and the carrier concentration $N_c$ in each of the passive regions and the carrier concentration $N_k$ in each of the active regions substantially conform to the relation, $$\frac{N_c}{N_k} > \frac{Mv_{01}}{\mu_c E_T}$$

where $v_{01}$ is the carrier drift velocity in the active region and $\mu_c$ is the mobility in the passive region.

11. The negative resistance device of claim 8 wherein: said active regions and said passive regions are all of substantially the same conductivity but the passive regions each have a larger cross-sectional area $A_c$ taken in a section transverse to the diode axis than the cross-sectional area $A_k$ of each of the active regions, in substantial accordance with the relationship, $$\frac{A_c}{A_k} \geq \frac{Mv_{01}}{\mu_c E_T}$$

12. The negative resistance device of claim 8 further comprising:

means for directing signal wave energy to be amplified to the diode and thence to a load having a load resistance $R_L$ which substantially conforms to the relationship, $$\frac{k}{|-G|} > R_L$$

where $-G$ is the negative conductance of each active region at the signal wave frequency and $k$ is the number of active regions of the diode.

13. The negative resistance device of claim 8 further comprising:

a waveguide in which said diode is mounted;

said dielectric substrate extending substantially the entire distance between opposite walls of said waveguide;

and wherein said diode includes a plurality of independent arrays of active and passive regions, each of said arrays being in contact with said substrate and each extending to the ohmic contacts at opposite ends thereof.

References Cited

UNITED STATES PATENTS

| | | | |
|---|---|---|---|
| 3,262,059 | 7/1966 | Gunn et al. | 330—5 |
| 3,295,064 | 12/1966 | White | 328—58 |

NATHAN KAUFMAN, Primary Examiner

U.S. Cl. X.R.

317—234; 330—5, 61; 331—107